United States Patent [19]
Komori

[11] Patent Number: 5,506,978
[45] Date of Patent: Apr. 9, 1996

[54] MEMORY APPARATUS INCLUDING A SHIFT CIRCUIT FOR SHIFTING A WORD SELECT SIGNAL BY A PREDETERMINED NUMBER OF WORDS

[75] Inventor: Shinji Komori, Itami, Japan

[73] Assignee: Mitsubishi Denki Kabushiki Kaisha, Tokyo, Japan

[21] Appl. No.: 62,630

[22] Filed: May 18, 1993

[30] Foreign Application Priority Data

May 18, 1992 [JP] Japan ................................. 4-124571

[51] Int. Cl.$^6$ .................................................. G06F 13/00
[52] U.S. Cl. ......................... 395/436; 395/484; 395/494; 364/238.7; 364/239.3; 364/244.5; 364/ DIG. 1
[58] Field of Search .............................. 364/239.3, 238.7, 364/244.5; 395/436, 484, 494

[56] References Cited

U.S. PATENT DOCUMENTS

| 4,680,738 | 7/1987 | Tam | 365/239 |
| 4,954,994 | 9/1990 | Hashimoto | 365/230.06 |
| 4,985,872 | 1/1991 | Halbert, III | 365/230.09 |
| 5,105,389 | 4/1992 | Matsuo et al. | 365/230.01 |

FOREIGN PATENT DOCUMENTS 2-244350  9/1990  Japan.
2-255929  10/1990  Japan.

*Primary Examiner*—Tod R. Swann
*Assistant Examiner*—Frank J. Asta
*Attorney, Agent, or Firm*—Lowe, Price, LeBlanc & Becker

[57] ABSTRACT

A memory apparatus and a data processor using the same, wherein a shift circuit 12 which shifts a word select signal generated by an address decoder 11 by a predetermined number of words and gives it to a memory when a predetermined signal is given from the outside, is included, and the word select signal, which is a decoded address signal inputted from the outside, is given intact to the memory when the predetermined signal is not given to the shift circuit 12, and the word select signal is shifted and given to the memory when the predetermined signal is given to the shift circuit 12, so that the word different word addresses are accessed when the same address signal is given, thereby the word contiguous to the inputted address can be accessed with a simple configuration and a small amount of hardwares and by restraining increase of power consumption.

8 Claims, 12 Drawing Sheets

Fig. 3
Prior Art

| SUBMEMORY | WORD ADD. |
|---|---|
| $M_0$ | $W_1+1$ |
| ⋮ | ⋮ |
| $M_{w0}+1$ | $W_1+1$ |
| $M_{w0}$ | $W_1$ |
| $M_{w0}+1$ | $W_1$ |
| ⋮ | ⋮ |
| $M_n$ | $W_1$ |

Fig. 4
Prior Art

| IN-WORD ADD. | DATA ORDER ON DATA BUS |
|---|---|
| 0 | $m_0$  $m_1$ ----- $m_n$ |
| 1 | $m_1$  $m_2$ ----- $m_0$ |
| ⋮ | ⋮ |
| n | $m_n$  $m_0$ ----- $m_{n-1}$ | ms) 1020, 1021, 1022 and a word select address generating circuit 1018.
MEMORY APPARATUS INCLUDING A SHIFT CIRCUIT FOR SHIFTING A WORD SELECT SIGNAL BY A PREDETERMINED NUMBER OF WORDS

BACKGROUND OF THE INVENTION

1. Field of the Invention

The present invention relates to a memory apparatus and a data processor using the same, and, more particularly, it relates to a memory apparatus and a data processor using the same capable of generating a contiguous word address automatically from a word address which is to be accessed originally, when accessing a memory across a word boundary.

2. Description of the Related Art

Generally speaking, a memory apparatus is constituted by, a memory body (hereinafter, merely referred to as a memory), a decoder which decodes an address signal inputted from the outside of the memory apparatus for designating an address to be accessed, a sense amplifier for amplifying a data signal read from the memory so as to output to the outside of the memory apparatus, and a driver which drives a data signal given from the outside when writing data to memory and so on.

Now, there is a case where the address of one-bit unit or the bit address is granted to the memory, or a case where the address of one-word unit or the word address is granted, or a case where the both are granted. When accessing such memory to which the word address is granted, there is a case where, depending on the instruction and data, two words of the original address and its contiguous word are accessed at a time, and furthermore, when accessing the memory capable of storing one-word-length data across a word boundary, the two contiguous words must be accessed together.

Conventionally, the memory apparatus, wherein the one-word-length data can be arranged on the memory across the word boundary, is constituted as shown in a block diagram of FIG. 1.

A main storage 1001 as the memory is connected to a main storage access unit 1002 via an address bus 1003 and a data bus 1004, and word data on the main storage 1001 designated by an address signal given via the address bus 1003 is outputted to the data bus 1004. Inside of one word in the main storage 1001 is allocated to in-word addresses 0 to n, and a memory access request outputted from the main storage access unit 1002 is available only in a word unit. And, when accessing the one-word-length data whose word address starts from $W_1$, and in-word address starts from $W_0$, the address $W_1$ of all submemories 1005, 1006, 1007 are accessed by submemory address buses 1008, 1009, 1010, and data $m_0$, $m_1$, $m_2$ are read and written via submemory data buses 1011, 1012, 1013.

At this time, when the in-word address $W_0$ is other than zero, the main storage access unit 1002 judges it and a next word address $W_1+1$ is also accessed in a same manner. Two one-word data accessed in the manner described above are composed in the main storage access unit 1002, thereby to obtain a desired one-word data.

However, in the conventional configuration as described above, in case only reading and writing of the one-word-length data of any address is required, since the memory access is always performed twice when the data extends over two words on the main storage 1001, the memory access takes a long time.

From such circumstances, the invention disclosed in, for example, Japanese Patent Application Laid-Open No. 2-244350 (1990), has been proposed. The invention disclosed in Japanese Patent Application Laid-Open No. 2-244350 (1990) has its configuration shown in a block diagram of FIG. 2. In FIG. 2, numeral 1014 designates a main storage capable of storing one-word-length data across the word boundary, and connected to a main storage access unit 1015 and an in-word location exchange circuit 1019 via an address bus 1016 and a data bus 1017. The main storage 1014 is composed by n+1 units of submemories ($M_0$, $M_1$ ... Mn) 1020, 1021, 1022 and a word select address generating circuit 1018.

Access to the submemories 1020, 1021, 1022 is conducted independently for the submemory address buses 1023, 1024, 1025 and for the submemory data buses 1026, 1027, 1028 respectively, respective access data values being designated as $m_0$, $m_1$ ... $m_n$. The word select address generating circuit 1018 receives as inputs a word select address bus 1029 indicating a word address in the address bus 1016 and an in-word select address bus 1030 indicating an in-word address, and generates the submemory to be accessed and its word select address according to an operation table shown in FIG. 3, from respective values $W_1$ and $W_0$ of the word address and the in-word address, and outputs to the submemory address buses 1023, 1024, 1025.

Meanwhile, the in-word location exchange circuit 1019 receives as an input an in-word select address bus 1031 indicating the in-word address, rearranges order of data $m_0$, $m_1$, $m_2$ corresponding to the submemory data buses 1026, 1027, 1028 of the data bus 1017 from the in-word address value $W_0$ so as to align them, according to an operation table shown in FIG. 4.

By the configuration as described above, the main storage 1014, when reading one-word-length data from the address $W_0$ indicated by the in-word select address bus 1030 in the word address $W_1$ indicated by the word select address bus 1029, responsive to the access request from the main storage access unit 1015 connected through the address bus 1016, reads submemory data from the $W_0$-th to n-th in-word address of the word address $W_1$, and submemory data from the 0-th to ($W_0$−1)-th in-word address of the word address $W_1+1$ by one access.

Meanwhile, the data $m_0$, $m_1$ ... mn thus read out are transferred to the in-word location exchange circuit 1019 by one bus cycle, rearranged into the one-word-length data in order of $m_{w0}$, ... $m_n$, $m_0$ ... $mw_{w0-1}$, and sent to the main storage access unit 1015.

The writing operation of such one-word-length data is similar to the aforementioned reading operation.

As a similar art, the invention disclosed in Japanese Patent Application Laid-Open No. 2-255929 (1990) is known. The invention of the Japanese Patent Application Laid-Open No. 2-255929 (1990), frankly speaking, adopts a configuration including an adder for supplying the word address next to the word address at a start position of the data to be accessed from a (IPU, when it is indicated by the data length and data position to be accessed that the access extends over the word boundary.

As such, in the above-mentioned invention of the Japanese Patent Application Laid-Open No. 2-255929 (1990), the adder for giving the address to be accessed to the memory apparatus across the word boundary is included.

Meanwhile, in the aforementioned invention of the Japanese Patent Application Laid-Open No. 2-244350 (1990), though generating means (corresponding to the above-mentioned adder) of the contiguous word address is not defined, it is believed that substantially the same configuration is premised. Its ground is that, word lines which give the output of the word select address generating circuit (numeral 1018 in FIG. 2) respectively to the submemories are independent for respective submemories. Thus, it is clear that it is so constituted that, both the start portion address of the word to be accessed and the contiguous word address are prepared in the word select address generating circuit beforehand and are given to the submemories.

Now, since the memory is allowed to be accessed across the word boundary, when the configuration as shown in the conventional example is adopted, the following problems are encountered.

In order to generate the contiguous word address, an adder (or an incrementer) and a selector circuit for selecting either an input or an add result of the adder must be included. And hence, the amount of hardwares increases, and furthermore, since add processing has to be executed in the process of deciding an output value of the word select line to be given, practically, to the memory after the start address to be accessed is decided, the memory access time is considerably elongated.

Since the different addresses or word select lines must be provided independently for the respective submemories, the amount of hardwares is increased.

Since electric power consumption increases due to the reasons described above, in particular, such memory systems are not suitable for battery-driven-type processors.

SUMMARY OF THE INVENTION

The present invention has been devised in view of such circumstances, therefore, it is an object thereof to provide a memory apparatus and a data processor using the same capable of accessing a word which is contiguous to an inputted address, with a simple configuration and a small amount of hardwares and by restraining increase of electric power consumption.

A memory apparatus according to a first invention of the present invention includes, a shift circuit which shifts a word select signal generated by an address decoder by a predetermined number of words and gives it to the memory, when a predetermined signal is given from the outside.

In such memory apparatus according to the first invention of the present invention, when the predetermined signal is not given to the shift circuit, the word select signal, which is a decoded address signal inputted from the outside, is given intact to the memory, and when the predetermined signal is given to the shift circuit, the word select signal, which is the decoded address signal inputted from the outside, is shifted and given to the memory, thus by giving the same address signal, the different, word addresses are accessed.

And, a data processor according to the first invention of the present invention comprises a plurality of abovementioned memory apparatuses, and a microprocessor which gives the address signal to the memory apparatuses for access, and includes converting means for converting order of data inputted to and outputted from the memory apparatuses.

In such a data processor according to the first invention of the present invention, by giving one address signal, different word addresses of a plurality of memory apparatuses are accessed respectively, as required, and one-word data is read and written.

A memory apparatus according to a second invention of the present invention is constituted such that, one-word data is divided and stored into submemories to which addresses are allocated respectively as word addresses, the memory apparatus including shift circuits which shift the inputted word select signal by a predetermined number of words so as to output it, the number of the circuit being less than the submemories by one when a predetermined signal is given from the outside, and giving the word select signal outputted from the address decoder directly to one of the submemories, and via the shift circuits to the rest of the submemories.

Furthermore, a memory apparatus according to a third invention of the present invention is constituted such that, one-word data is divided and stored into submemories to which addresses are allocated respectively as word addresses, the memory apparatus including the same number of shift circuit as the submemories to shift the inputted word select signal by a predetermined number of words so as to output it, when a predetermined signal is given from the outside, and giving the word select signal outputted from the address decoder respectively to the submemories via the shift circuits.

In such memory apparatuses according to the second and third inventions of the present invention, the word select signal, which is the decoded address signal inputted from the outside, is given to the submemories after being shifted responsive to the predetermined signal given to the shift circuits, or without being shifted, and by giving the same address signal, the different word addresses of the respective submemories are accessed.

Also, a data processor according to the second invention of the present invention comprises, the above-mentioned memory apparatus, a microprocessor which gives the address signal to the memory apparatus for access, and includes means for giving a predetermined signal to the shift circuits of the memory apparatus, and converting means for converting order of data inputted to and outputted from the memory apparatus.

Furthermore, a data processor according to the third invention of the present invention comprises, the abovementioned memory apparatus, a microprocessor which gives the address signal to the memory apparatus for access, and includes means for giving a predetermined signal to the shift circuits of tile memory apparatus, and converting means for converting order of data inputted to and outputted from the memory apparatus.

In such data processors according to the second and third inventions of the present invention, by giving one address signal, different word addresses of a plurality of submemories are accessed respectively, as required, and one-word data extending over the different word addresses is read, or the one-word data is written across the different word addresses.

The above and further objects and features of the invention will more fully be apparent from the following detailed description with accompanying drawings.

BRIEF DESCRIPTION OF THE DRAWINGS

FIG. 3 is a table showing an operating state of a memory apparatus shown in FIG. 2, FIG. 4 is a table showing an operating state of a memory apparatus shown in FIG. 2.

DESCRIPTION OF THE PREFERRED EMBODIMENTS

In the following, the present invention is particularly described on the bases of the drawings showing its embodiments.

Figure 1:
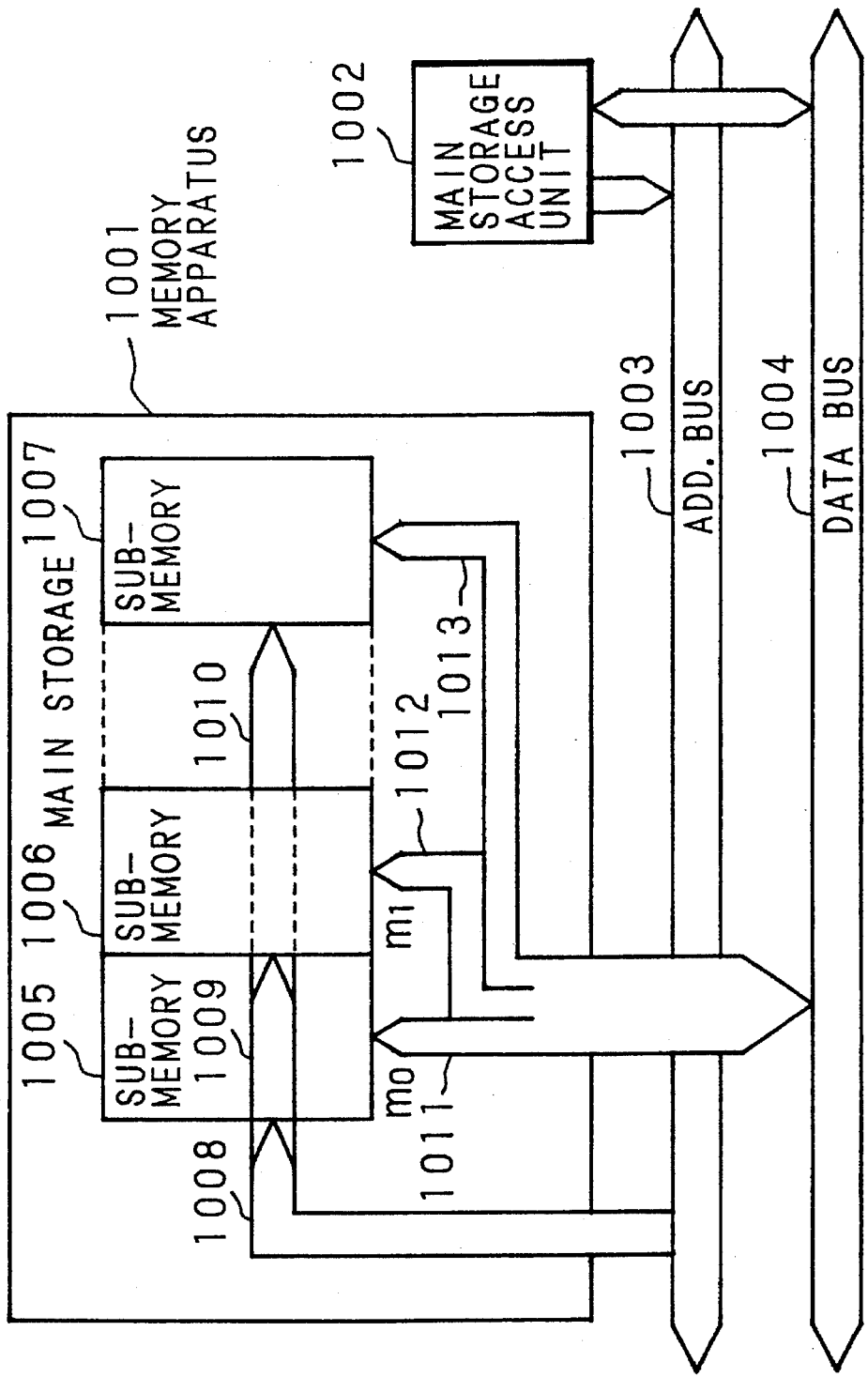
FIG. 1 is a block diagram showing a configuration of a conventional memory apparatus, in which one-word-length data can be arranged on a memory across a word boundary.
Figure 2:
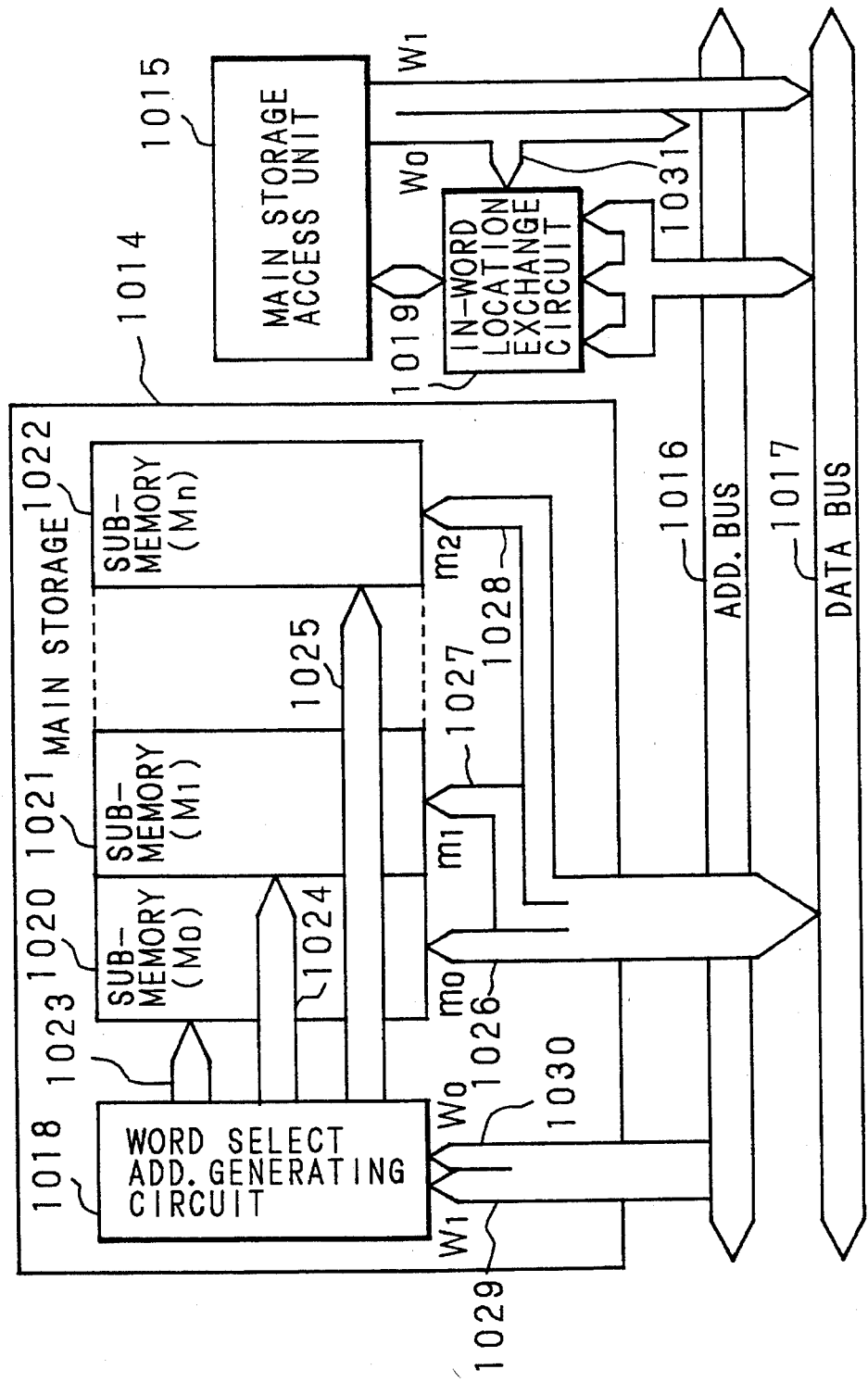
FIG. 2 is a block diagram showing another configuration of a conventional memory apparatus, in which one-word-length data can be arranged on a memory across a word boundary.
Figure 5:
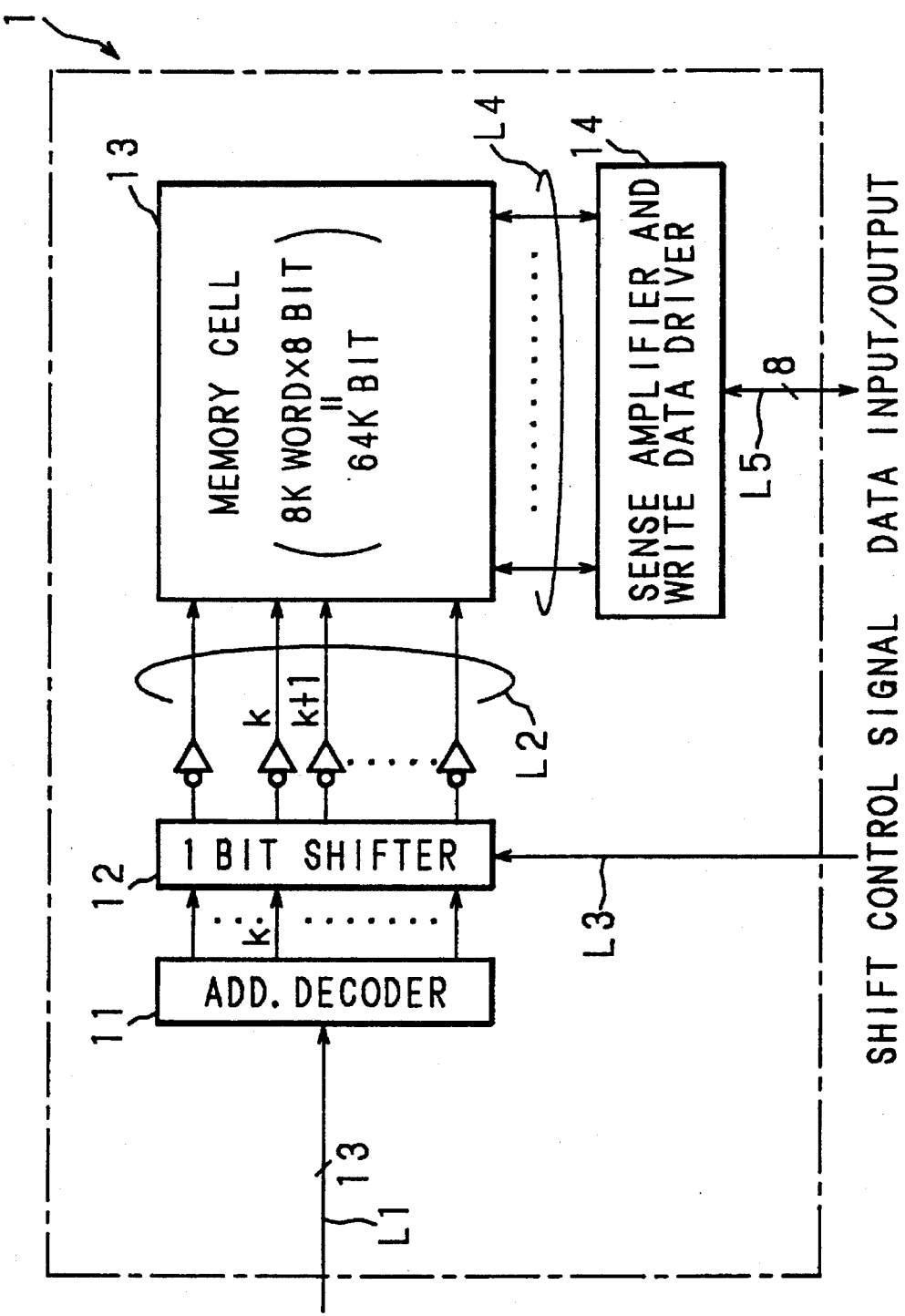
FIG. 5 is a block diagram showing a configuration of one embodiment of a memory apparatus according to a first invention of the present invention.

FIG. 5 is a block diagram showing a configuration of one embodiment of a memory apparatus according to a first invention of the present invention.

In FIG. 5, a range surrounded by a one-dot-chain line designated by numeral 1 is the memory apparatus of the present invention. The memory apparatus 1 of the present invention is constituted by, a memory body (hereinafter, referred to as a memory cell) 13 of 8K words×8 bits, that is, 64K-bit configuration, an address decoder 11 which decodes an address signal input given to the memory apparatus 1 from the outside via a 13-bit address signal line L1, a 1-bit shifter 12 which shifts a $2^{13}$-bit word select signal decoded by the address decoder 11 by one bit and gives it to the memory cell 13, and a sense amplifier and write data driver 14 for outputting data read from the memory cell 13 to the outside, or for driving to write data into the memory cell 13.

The word select signal is propagated to the memory cell 13 from the 1-bit shifter 12 via word lines L2 respectively provided with inverters. A shift control signal is given to the 1-bit shifter 12 from the outside via a shift control signal line L3, and when the shift control signal is a low level, the 1-bit shifter 12 outputs intact the $2^{13}$-bit word select signal inputted from the address decoder 11 to the word lines L2, and when the shift control signal is a high level, the 1-bit shifter 12 outputs the $2^{13}$-bit word select signal inputted from the address decoder 11 to the word lines L2 by shifting one bit.

Meanwhile, between the memory cell 13 and the sense amplifier and write data driver 14 is connected by a bit line L4. When data is read from the memory cell 13, the data signal is outputted to the sense amplifier and write data driver 14 from the memory cell 13 via the bit line L4, and when data is written into the memory cell 13, the data signal is input,ted to the memory cell 13 from the sense amplifier and write data driver 14. Since the memory cell 13 of the embodiment adopts the 8K words×8 bits configuration, the bit lines L4 for 8 bits are used in data input and output.

Reference character L5 designates a data input/output line which receives and sends the data signal between the sense amplifier and write data driver 14 and the outside.

The operation of the memory apparatus according to the first invention of the present invention thus constructed is as follows.

A 13-bit address signal inputted from the outside via the address signal line L1 is decoded in the address decoder 11, outputted as the $2^{13}$(=8K)-bit word select signal and inputted to the 1-bit shifter 12.

The shift control signal is inputted to the 1-bit shifter 12 via the shift control signal line L3. When the shift control signal is a high level (active), the 1-bit shifter 12 shifts the word select signal by one bit for output. That is, when the shift control signal is the high level, the decode result of the address decoder 11 is shifted by one bit and a contiguous address is selected.

As a result, the contiguous address is accessed by one address for the address given from the outside via the address signal line L1. For example, when the address "k" is given from the outside, usually, the k-th word is accessed, however, when the shift control signal given to the 1-bit shifter 12 via the shift control signal line L3 is the high level, the (k+1)-th word is accessed.

Figure 6:
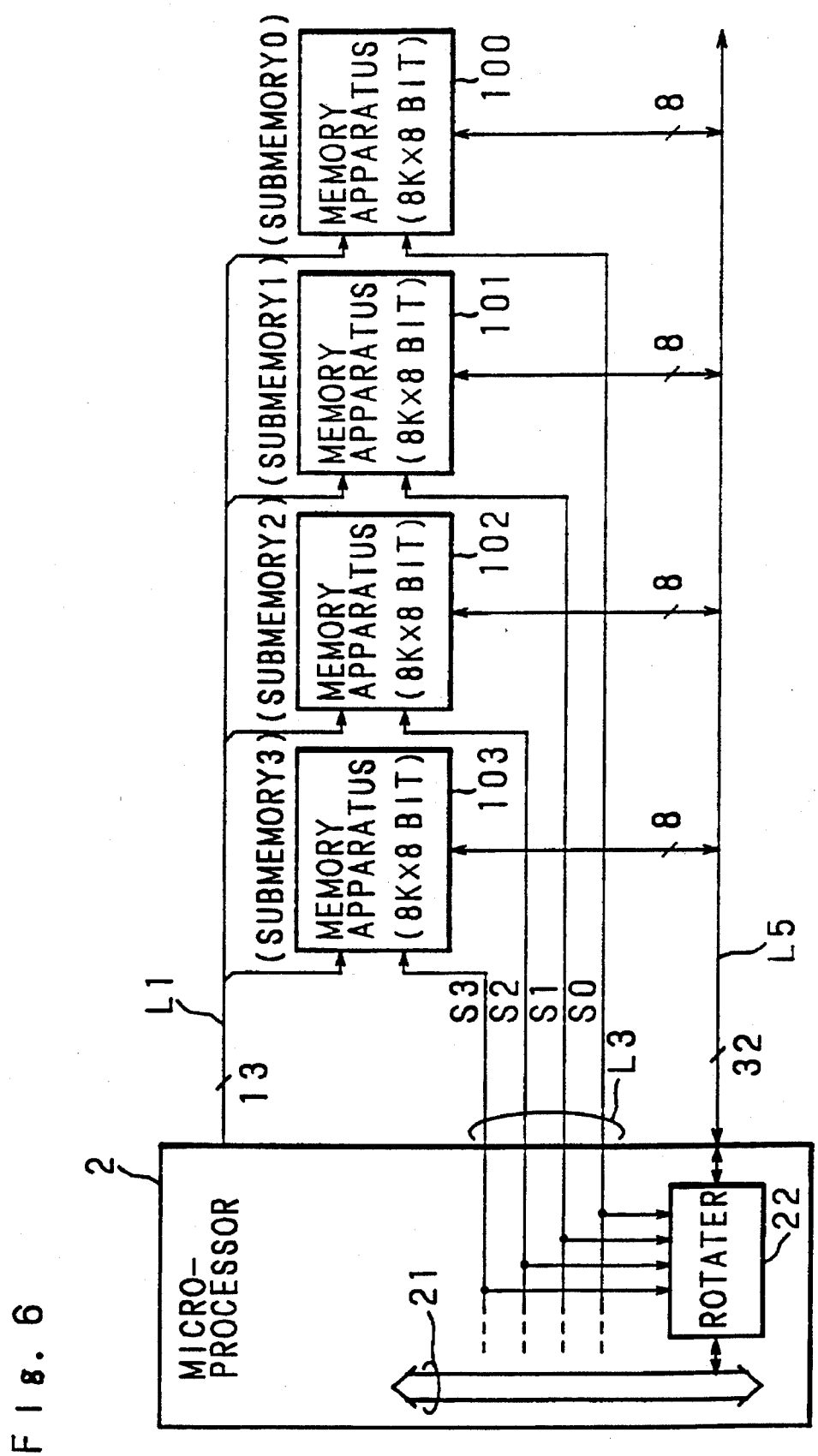
FIG. 6 is block diagram showing a configuration of a data a processor using the above-mentioned memory apparatus according to the first invention of the present invention.

FIG. 6 is a block diagram showing a configuration of a data processor using the above-mentioned memory apparatus according to the first invention of the present invention.

In FIG. 6, numeral 2 designates a microprocessor, in which an internal data bus 21, a rotator 22 and so on are incorporated. The memory apparatus designated by numeral 13 in FIG. 5 serves as an external memory of the microprocessor 2, and in this embodiment, four memory apparatuses are connected by an address signal line L1 and a data input/output line L5 as a submemory 0 100, a submemory 1 101, a submemory 2 102 and a submemory 3 103.

Furthermore, between the microprocessor 2 and the submemory 0 100, submemory 1 101, submemory 2 102 and submemory 3 103, separate shift control lines L3 are connected. More specifically, from the microprocessor 2, a shift control signal S0 is given to the submemory 0 100, a shift control signal S1 to the submemory 1 101, a shift control signal S2 to the submemory 2 102 and a shift control signal S3 to the submemory 3 103, respectively via the shift control signal lines L3.

The rotator 22 is provided so as to input data read from the submemory 0 100, submemory 1 101, submemory 2 102 and submemory 3 103 via the data input/output line L5 to rearrange it in 8-bit unit.

In such a data processor, at the time of external memory access by the microprocessor 2, the address signal of 13-bit width is outputted to the address signal line L1 and the 4-bit shift control signals S0 to S3 are outputted to the shift control signal lines L3 from the microprocessor 2. For example, when accessing 32 bits from the third byte of the word address "k", the shift control signal S0, S1, S2, S3 are controlled by the microprocessor 2 so that S0 and S1 of the shift control signals are made low level (nonactive) and S2 and S3 thereof are made high level (active) and given respectively to the submemory 0 100, submemory 1 101, submemory 2 102 and submemory 3 103.

At this time, to the submemory 0 100, submemory 1 101, submemory 2 102 and submemory 3 103, the address "k" is given commonly from the microprocessor 2 via the address signal line L1. However, since the shift control signals S3 and S2 given to the submemory 3 103 and the submemory 2 102 are the high level, in the submemory 3 103 and the submemory 2 102, practically, data corresponding to the address "k+1" is accessed.

When the submemory 0 100, submemory 1 101, submemory 2 102 and submemory 3 103 are accessed in such a manner and data are read respectively therefrom, the data are inputted to the rotator 22 of the microprocessor 2 via the data input/output line L5. And, the rotator 22 conducts rotate processing in a byte unit so that data of the submemory 1 101 is outputted to the higher bit side of the internal data bus 21 of the microprocessor 2.

Conversely, when accessing the submemory 0 100, submemory 1 101, submemory 2 102 and submemory 3 103 to write data respectively thereinto, the rotator 22 conducts rotate processing so that the higher bit side data of the internal data bus 21 of the microprocessor 2 is written into the submemory 1 101, and then outputs data to the data input/output L5.

In such a manner, even the memory access, which extends over the word boundary, can be processed at the same timing and same access cycle as the usual memory access. Description of the read/write control itself is omitted, since it is common to both the data write and data read in the above-mentioned description.

Figure 7:
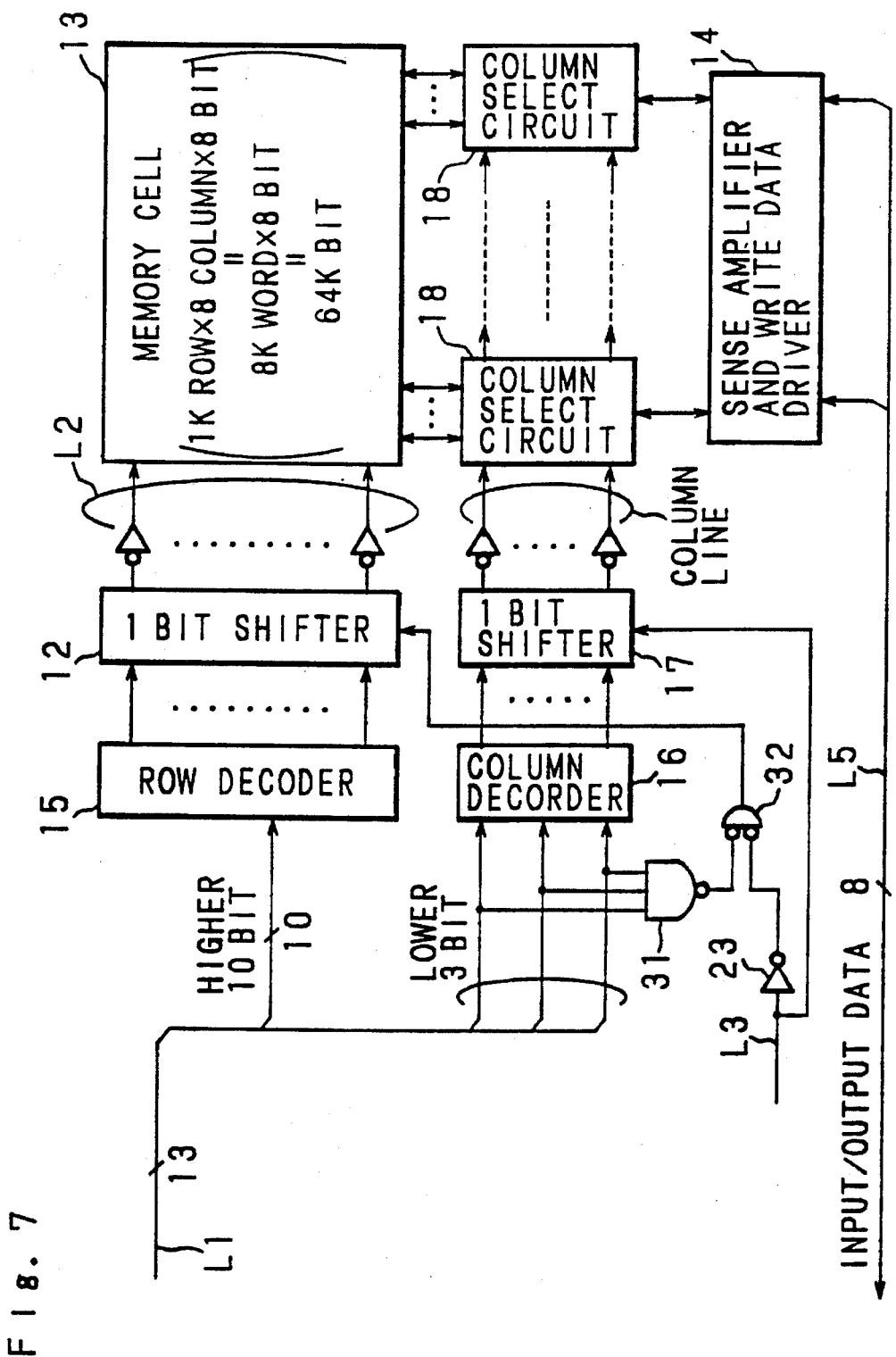
FIG. 7 is a block diagram showing a configuration of another embodiment of a memory apparatus according to the first invention of the present invention.

FIG. 7 is a block diagram showing a configuration of another embodiment of a memory apparatus according to the first invention of the present invention.

In most cases, generally, a semiconductor memory apparatus adopts a plural-column configuration in order to bring a length/width ratio of a memory cell arrangement close to one as much as possible, and minimize a load of the address decode processing. And hence, in the embodiment shown in FIG. 7, by adopting an eight-column configuration, a word direction of the 8K words×8 bits memory is compressed to 1/8 to make it to be 1K words, and bit lines are increased to 64. Column select circuits 18 are provided to select one line from eight bit lines per one bit. In this embodiment, the lower 3 bits in the 13-bit input address signal are inputted to a column decoder 16 in order to be used in selecting the column. The upper 10 bits in the 13-bit input address signal are inputted to a row decoder 15 in order to be used in selecting the row.

Thus, for accessing the contiguous address, though a 1-bit shifter 12 is provided in the configuration shown in FIG. 5 to shift the signal of the word line L2 bit by bit, in the case of this embodiment, a 1-bit shifter 17 is provided for shifting the signal outputted to column select lines from the column decoder 16 bit by bit.

Furthermore, in case the lower 3 bits of the input address signal are "111", the same column as the case where "000" is inputted is selected when the shift control signal is the high level. In this case, the decode result of the upper 10 bits must be shifted by one bit. For this purpose, a 3-input NAND gate 31 for detecting that the lower 3 bits are "111", and a 2-input NOR gate 32 which makes the signal active so as to shift the decode result of the row decoder 15 by one bit, only when the shift control signal given via the shift control signal line L3 is the high level, are provided.

Figure 8:
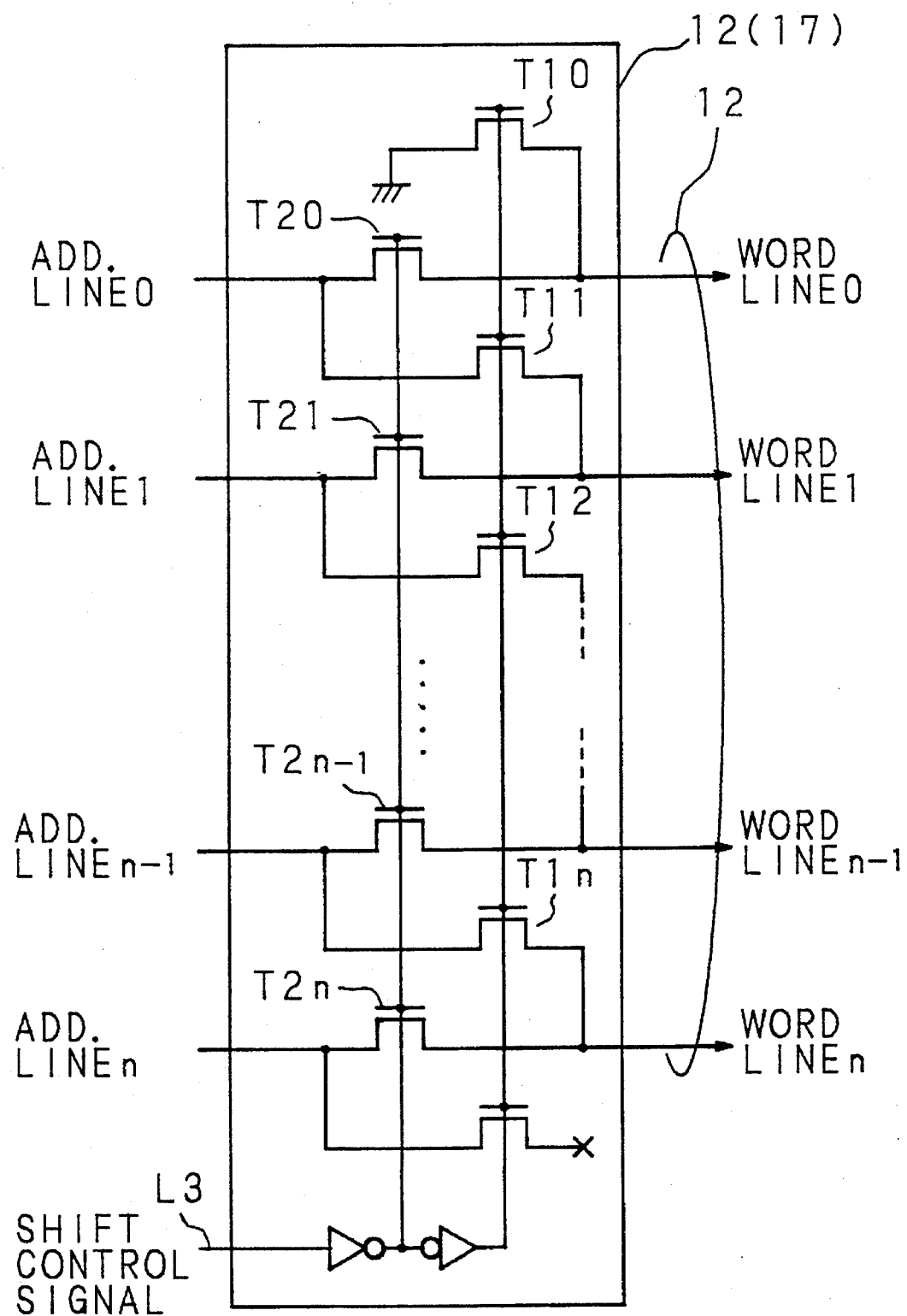
FIG. 8 is a circuit diagram showing an example of configuration of a 1-bit shifter of a memory apparatus according to the first invention of the present invention.

FIG. 8 is a circuit diagram showing an example of configuration of the 1-bit shifter 12 (or 17).

The 1-bit shifter 12 (or 17) is constituted by two n-channel transistors T10 (T11, T12 . . . T1n), T20 (T21, T22 wares. And, the transistors are subjected to ON/OFF control by the shift control signal given via the shift control signal line L3. For example, between an address line "1" and a word line "1", since the transistor T11 is OFF and the transistor T21 is ON when the shift control signal is the usual low level, the signal of the address line "1" is outputted intact to the word line "1". Meanwhile, since the transistor T11 is ON and the transistor T21 is OFF when the shift control signal is the high level, the signal of an address line "0" is shifted by one bit and outputted to the word line "1".

When the shift control signal is the high level, the signal "0" is outputted to a word line "0".

Thus, when the shift control signal given via the shift control signal line L3 is the low level, though the address decode result inputted from the address decoder 11 is outputted intact to word lines L2, when the shift control signal is the high level, all of the inputs are shifted by one bit, and for example, a value of the address "n−1" is outputted to the word line "n".

Figure 9:
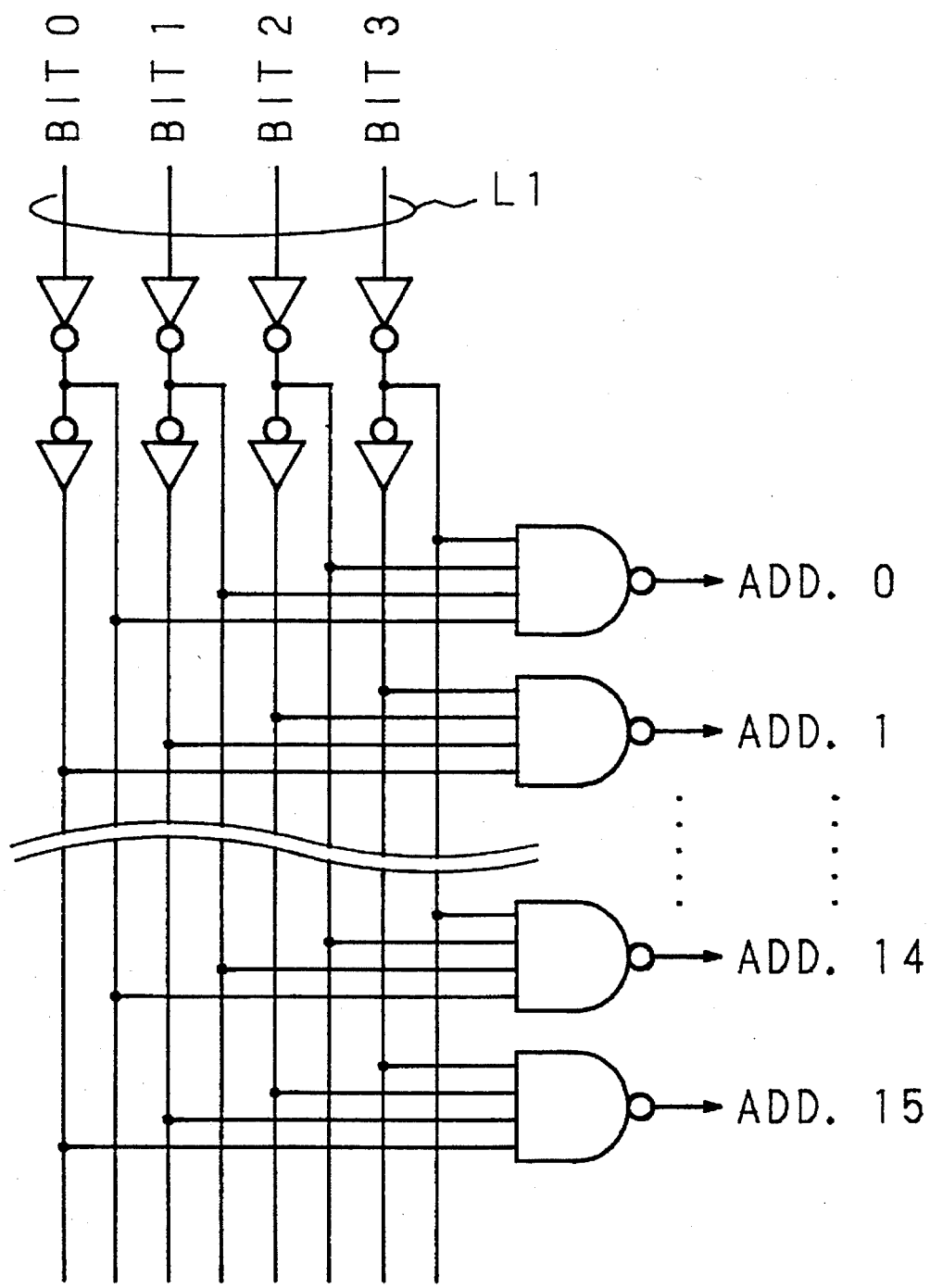
FIG. 9 is a circuit diagram showing an example of specific configuration of respective decoders such as an address decoder, a row decoder and a column decoder of a memory apparatus according to the first invention of the present invention.

FIG. 9 is a circuit diagram showing an example of specific configuration of the address decoder 11, row decoder 15 and column decoder 16. Hereupon, for the purpose of simplifying the description, the case where the address signal line L1 is a 4-bit input and an output signal is 16 bits is shown.

In the address decoder having such a configuration, when the address signal of 4-bit width is inputted via the address signal lines L1, one out of sixteen control signals becomes active (high level). For example, when a binary signal "1111" representing "15" of a decimal digit, is inputted as the input address signal, only the inputs of a 4-input NAND gate of a lowermost stage in FIG. 9 become all "1" and only an address 15 becomes low level.

Figure 10:
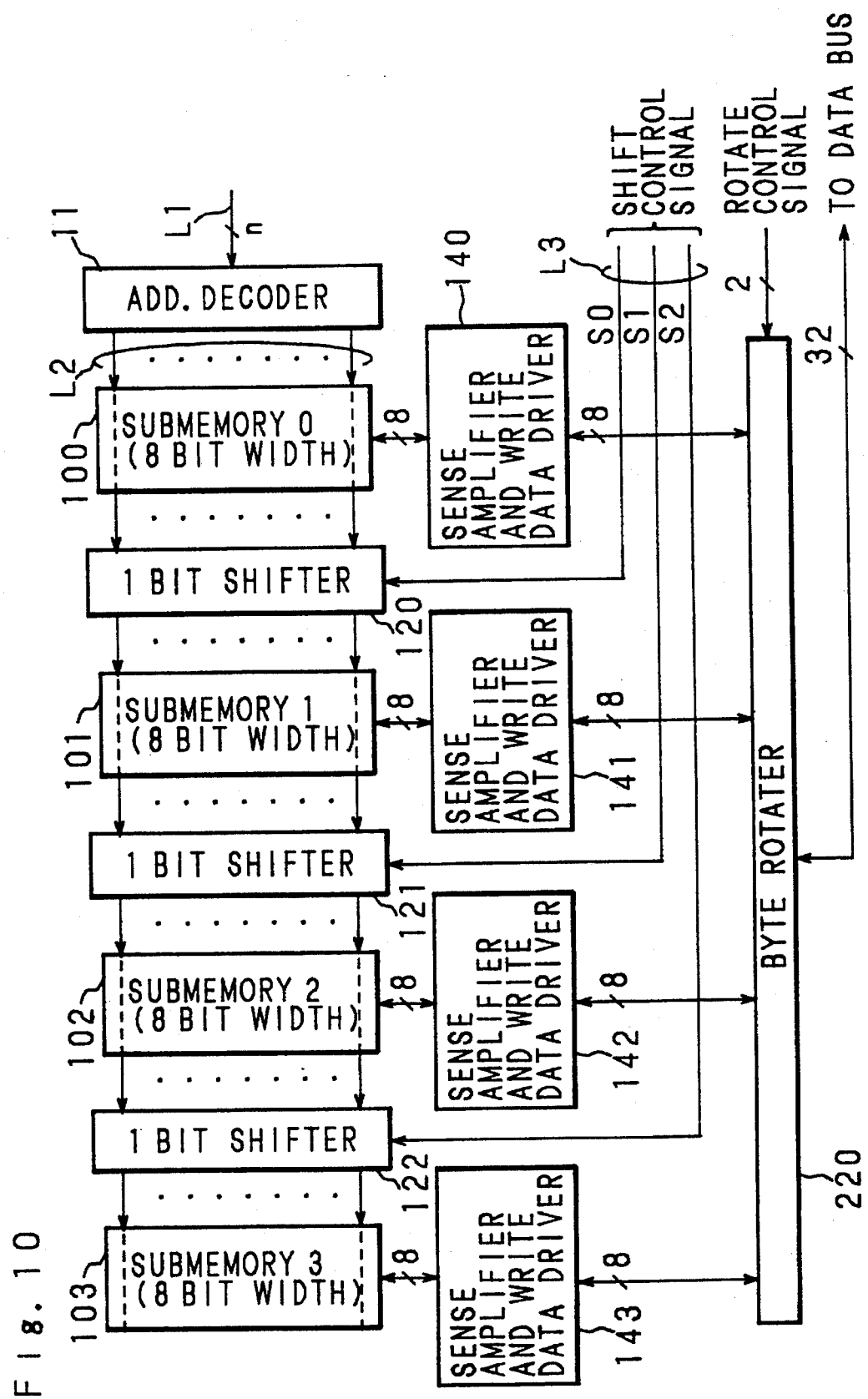
FIG. 10 is a block diagram showing a configuration of one embodiment of a memory apparatus according to a second invention of the present invention.

FIG. 10 is a block diagram showing a configuration of one embodiment of memory apparatus according to a second invention of the present invention.

In FIG. 10, numeral 11 designates an address decoder, to which the address signal is inputted from the outside via the address signal line L1 in the same way as the aforementioned first invention.

Numerals 100, 101, 102 and 103 designate 8-bit width submemory 0, submemory 1, submemory 2 and submemory 3. And, between the submemory 0 100, submemory 1 101, submemory 2 102 and submemory 3 103, 1-bit shifters 120, 121, 122 are arranged respectively. To the 1-bit shifters 120, 121, 122, shift control signals S0, S1, S2 are given respectively via the shift control signal lines L3.

Numerals 140, 141, 142 and 143 designate sense amplifier and write data drivers, which respectively connect the submemory 0 100, submemory 1 101, submemory 2 102, submemory 3 103 and a byte-rotator 220. The operation of such memory apparatus of the second invention of the present invention is as follows.

When an n-bit address signal is given to the memory apparatus from an address bus in a microprocessor, not shown in FIG. 10, it is decoded into $2^n$ word select signals by the address decoder 11 and at first, given to the submemory 0 100 via the word lines L2, then propagated in order, to the 1-bit shifter 120, submemory 1 101, 1-bit shifter 121, submemory 2 102, 1-bit shifter 122 and submemory 3 103.

At the time of word-unit access, in the case where a start byte is the submemory 3 103, since the same word may be selected for all of the submemory 0 100, submemory 1 101, submemory 2 102 and submemory 3 103, the shift control signal S2, S1, S0 are made low level. Also, the byte-unit rotator 220 does not rotate and transfers data in the existing byte order.

By such an operation, in the case of reading data, the data read from the submemory 0 100, submemory 1 101, submemory 2 102 and submemory 3 103 are outputted intact to the data bus as the one-word-length data by the byte-unit rotator 220. Meanwhile, in the case of writing data, the one-word-length data is written intact into the submemory 0 100, submemory 1 101, submemory 2 102 and submemory 3 103 from the data bus via the byte-unit rotator 220.

Meanwhile, for example, when the start address is the submemory 1 101 at the time of word-unit access, it is necessary to read the next word for the submemory 3 103 and the submemory 2 102. In such a case, only S1 among the shift control signals may be made high level. Thereby, for example, when "k" is given as an address, since the 1-bit shifter 120 outputs intact the address signal from the submemory 0 100 to the submemory 1 101, the address "k" is accessed for the submemory 1 101 and the submemory 0 100. Also, since the 1-bit shifter 121 shifts the address signal from the submemory 1 101 by one bit and outputs it to the submemory 2 102, for which an address "k+1" is accessed. Meanwhile, since the 1-bit shifter 122 outputs intact the address signal from the submemory 2 102 to the submemory 3 103, for the submemory 3 103, the address "k+1" is accessed.

In this case, by conducting 2-byte rotate by the byte-unit rotator 220, the start byte read from the submemory 1 101 can be rearranged to a higher position.

Relationship between the start byte position of the word to be accessed, or the submemories storing the start byte, the shift control signal and the rotate control signal is shown in Table 1.

TABLE 1

| Start Byte | S0 | S1 | S2 | Rotate Control Signal |
|---|---|---|---|---|
| Submemory 0 | 1 | 0 | 0 | 3 |
| Submemory 1 | 0 | 1 | 0 | 2 |
| Submemory 2 | 0 | 0 | 1 | 1 |
| Submemory 3 | 0 | 0 | 0 | 0 |

Figure 11:
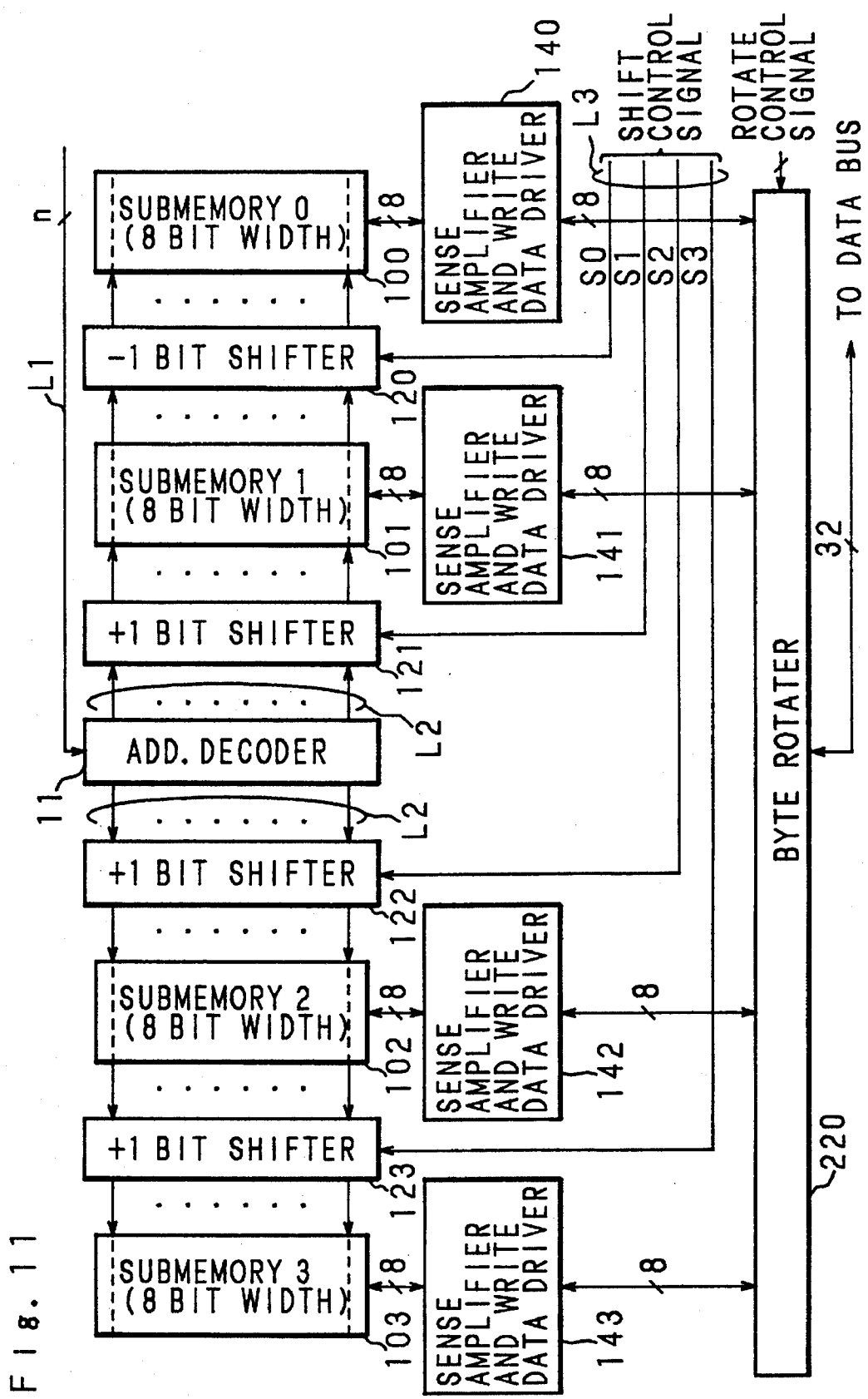
FIG. 11 is a block diagram showing an example of configuration of a memory apparatus according to a third invention of the present invention.

FIG. 11 is a block diagram showing an example of configuration of a memory apparatus according to a third invention of the present invention.

In order to minimize a skew or fluctuations of the memory access time between the bits, it is desirable to constitute so that the decode address is transferred to the submemory 0 100, submemory 1 101, submemory 2 102 and submemory 3 103 as simultaneously as possible. And hence, from a viewpoint of layout of the hardwares, it is desirable to dispose the address decoder 11 at time center of the submemories 100, 101, 102, 103 group. Such consideration is taken into an example of configuration shown in FIG. 11.

The operation in case of adopting such a configuration may be made basically similar to the aforementioned configuration shown in FIG. 10, by adjusting the relationship between the start byte position, shift control signal and rotate control signal. The relationship between the start byte position, shift control signal and rotate control signal of the configuration shown in FIG. 11 is shown in Table 2.

TABLE 2

| Start Byte | S0 | S1 | S2 | S3 | Rotate Control Signal |
|---|---|---|---|---|---|
| Submemory 0 | 1 | 1 | 1 | 0 | 3 |
| Submemory 1 | 0 | 0 | 1 | 0 | 2 |
| Submemory 2 | 0 | 0 | 0 | 1 | 1 |
| Submemory 3 | 0 | 0 | 0 | 0 | 0 |

Figure 12:
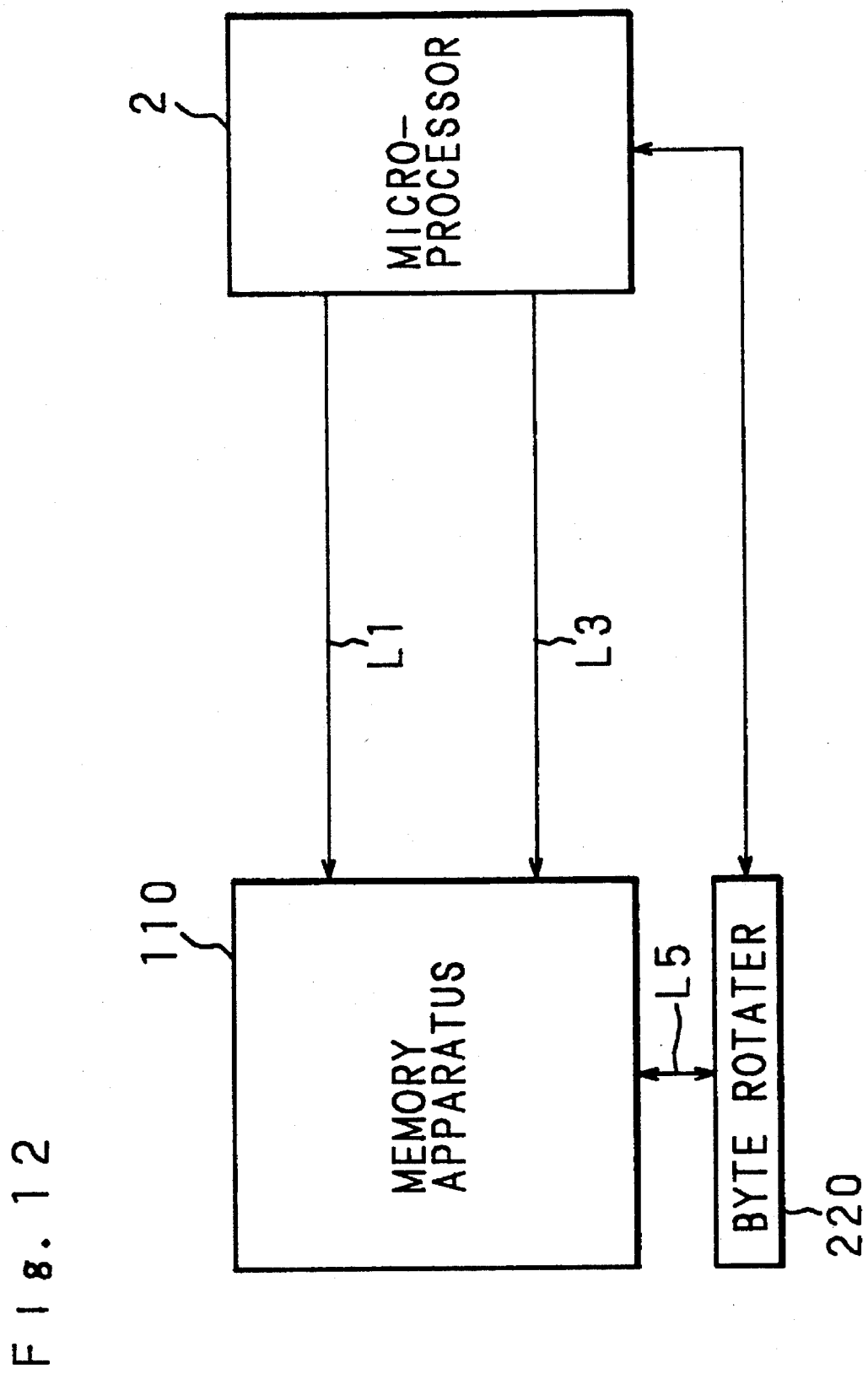
FIG. 12 is a block diagram showing a configuration of a data processor using the above-mentioned memory apparatus according to the second and third inventions of the present invention.

FIG. 12 is a block diagram showing a configuration of a data processor using the aforementioned memory apparatus according to a second invention and a third invention of the present invention.

In FIG. 12, numeral 2 designates a microprocessor. The memory apparatus 110 of the second invention of the present invention shown in FIG. 10 and FIG. 11 is connected to the microprocessor 2 via an address signal line L1 and a shift control signal line L3. Meanwhile, a byte-unit rotator 220 is connected to the memory apparatus 110 by a data input/output line L5, and also to a data bus of the microprocessor 2.

In such data processor, as shown in the Table 1 or Table 2, the microprocessor 2 controls the shift control signal.

In the aforementioned embodiments, the memory apparatus which is constituted by four submemories in which one word is 32 bits, is described as an example, the present invention is not limited to such condition. It is also applicable to a processor which requires to read plural number of words simultaneously from a memory, such as a super-scalar type microprocessor.

In the aforementioned embodiments, though only the configuration wherein the signal outputted from the address decoder is shifted by one bit has been described, it is not limited thereto, and in the data processor and the like which is so constructed that a logical one word corresponds to physical plural number of words, it is also possible to be constructed so that the signal is shifted by several bits.

In the aforementioned embodiments, though the case where the address bus and the data bus are disposed independently has been described, it is to be understood that it is also applicable to the configuration wherein one bus is used commonly.

Furthermore, in the aforementioned embodiments, though only the case of word-unit access has been described, the present invention is extensively effective for the memory access which extends over various word boundaries such as the 2-byte access, 3-byte access, and further, a number of plural accesses. However, for the 2-byte access, 3-byte access and so on, the write control is necessary respectively for the submemories as in the past.

Still further, in the aforementioned embodiments, though a configuration wherein a byte-unit rotator is provided as the hardware is shown, the same processing is also possible by a CPU, and the rotator itself can entrust the CPU with the processings.

Furthermore, in the aforementioned embodiments, as shown in, for example, FIG. 5 and FIG. 7, though an example of installing a level holding inverter between a shift circuit and a word select line, and an example of not installing the inverter are shown, the present invention is not essentially affected in either case.

As particularly described heretofore, according to the present invention, by adding a circuit which shifts the word select signal given to the memory, a conventional adding circuit and address selecting selector circuit are not required, and with a simple and small amount of hardwares, the memory access extending over the word boundary can be accomplished by one access. Particularly, contrary to the conventional example wherein the adder layout is done entirely separately from the memory, in case of the present invention using the shift circuit, layout efficiency is improved considerably, because it is possible to arrange adjacent to the memory and the submemories.

Also, by adding the circuit which shifts the word select signal given to the memory, the memory access extending over the word boundary can be speed up as compared with the conventional example which requires the adder.

Furthermore, since the memory access extending over the word boundary is possible by just giving one address, as compared with the conventional example such as the invention of Japanese Patent Application Laid-Open No. 2-244350 (1990) wherein the address is given twice separately, it is possible to improve utilization efficiency of the bus and memory, thereby performance of the entire system can be improved.

Still further, since the memory access is possible by a small amount of hardwares and a little number of cycles, power consumption is reduced as compared with the conventional apparatus in case of conducting the same processing.

As this invention may be embodied in several forms without departing from the spirit, of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A memory apparatus, comprising:

an address decoder which decodes an address signal provided from a source external to said memory apparatus and generates a word select signal;

a plurality of submemories, to each which common word addresses are allocated, and in which one-word data is divided and each divided data is stored in each submemory respectively, and a word address of each submemory corresponding to the word select signal generated by said address decoder is accessed respectively; and shift circuits which are one unit less than said submemories, and shift the inputted word select signal by a predetermined number of words respectively so as to output the shifted word select signal when a predetermined signal is provided to said shift circuits from the external source;

whereby the word select signal generated by said address decoder is given directly to one of the submemories, and to the rest of the submemories via said shift circuits respectively.

2. A memory apparatus, comprising:

an address decoder which decodes an address signal provided from a source external to said memory apparatus and generates a word select signal;

a plurality of submemories, to each which common word addresses are allocated, and in which one-word data is divided and each divided data is stored in each submemory respectively, and a word address of each submemory corresponding to the word select signal generated by said address decoder is accessed respectively; and the same number of shift circuits as said submemories, which shift the inputted word select signal by a predetermined number of words respectively to output the shifted word select signal when a predetermined signal is provided to the shift circuits from the external source;

whereby the word select signal generated by said address decoder is given respectively to said submemories via respective said shift circuits.

3. A data processor, comprising a plurality of memory apparatuses, each having an address decoder which decodes an address signal provided from a source external to such memory apparatus and generates a word select signal;

a memory, to which addresses are allocated as word addresses, and in which a word address corresponding to the word select signal generated by said address decoder is accessed; and shift circuits which shift the word select signal generated by said address decoder by a predetermined number of words and give the shifted word select signal to said memory when a predetermined signal is provided to the shift circuits from the external source; and a microprocessor, which accesses each of said memory apparatuses by giving the address signal to each of said memory apparatuses, and includes means for generating said predetermined signal given to each of said shift circuits, and converting means for converting input/output order of data to each of said memory apparatuses corresponding to the predetermined signal given to each of said shift circuits.

4. A data processor as set forth in claim 3, wherein said converting means is a rotator which rearranges data read from/written in said memory apparatus word by word.

5. A data processor, comprising:

a memory apparatus, having:

an address decoder which decodes an address signal provided from a source external to said memory apparatus and generates a word select signal;

a plurality of submemories, to each which common word addresses are allocated, and in which one-word data is divided and each divided data is stored in each submemory respectively, and a word address of each submemory corresponding to the word select signal generated by said address decoder is accessed respectively; and shift circuits which are one unit less than said submemories, and shift the inputted word select signal by a predetermined number of words respectively so as to output the shifted word select signal when a predetermined signal is provided to said shift circuits from the external source whereby the word select signal generated by said address decoder is given directly to one of the submemories, and to the rest of the submemories via said shift circuits respectively; and a microprocessor which accesses said memory apparatus by giving the address signal to said memory apparatus, and includes means for generating said predetermined signal given to said shift circuits; and means for converting input/output order of data to said memory apparatus corresponding to the predetermined signal given respectively to said shift circuits.

6. A data processor as set forth in claim 5, wherein said converting means is a rotator which rearranges data read from/written in said memory apparatus word by word.

7. A data processor, comprising:

a memory apparatus, having:

an address decoder which decodes an address signal provided to said memory apparatus and generates a word select signal;

a plurality of submemories, to each which common word addresses are allocated, and in which one-word data is divided and each divided data is stored in each submemory respectively, and a word address of each submemory corresponding to the word select signal generated by said address decoder is accessed respectively; and the same number of shift circuit as said submemories, which shift the inputted word select signal by a predetermined number of words respectively to output it when a predetermined signal is provided to said shift circuits, whereby the word select signal generated by said address decoder is given respectively to said submemories via respective said shift circuits;

a microprocessor which accesses said memory apparatus by giving the address signal to said memory apparatus, and includes means for generating said predetermined signal given to said shift circuits; and means for converting input/output order of data to said memory apparatus corresponding to the predetermined signal given respectively to said shift circuits.

8. A data processor as set forth in claim 7, wherein said converting means is a rotator which rearranges data read from/written in said memory apparatus word by word.

* * * * *